United States Patent
Xu et al.

(10) Patent No.: US 11,296,682 B2
(45) Date of Patent: Apr. 5, 2022

(54) INPUT CIRCUIT OF A FLIP-FLOP AND ASSOCIATED MANUFACTURING METHOD

(71) Applicant: TAIWAN SEMICONDUCTOR MANUFACTURING COMPANY LTD., Hsinchu (TW)

(72) Inventors: Jin-Wei Xu, Hsinchu (TW); Hui-Zhong Zhuang, Kaohsiung (TW); Chih-Liang Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/837,886

(22) Filed: Apr. 1, 2020

(65) Prior Publication Data

US 2021/0313972 A1  Oct. 7, 2021

(51) Int. Cl.
- *H01L 21/8238* (2006.01)
- *H01L 23/528* (2006.01)
- *H01L 27/092* (2006.01)
- *H03K 3/356* (2006.01)

(52) U.S. Cl.
CPC ............... *H03K 3/356017* (2013.01); *H01L 21/823871* (2013.01); *H01L 23/528* (2013.01); *H01L 27/092* (2013.01)

(58) Field of Classification Search
CPC .......... H01L 21/823871; H01L 23/528; H01L 27/092
See application file for complete search history.

(56) References Cited

U.S. PATENT DOCUMENTS

| | | | | |
|---|---|---|---|---|
| 5,055,710 A | * | 10/1991 | Tanaka | G01R 31/318538 326/47 |
| 2011/0032016 A1 | * | 2/2011 | Maeno | H03K 3/356156 327/203 |

* cited by examiner

*Primary Examiner* — Herve-Louis Y Assouman
(74) *Attorney, Agent, or Firm* — WPAT, P.C., Intellectual Property Attorneys; Anthony King

(57) ABSTRACT

An input circuit of a flip-flop includes: a first gate strip, a second gate strip and a third gate strip. The first gate strip is a co-gate terminal of a first PMOS and a first NMOS; the second gate strip is disposed immediately adjacent to the first gate strip, and a co-gate terminal of a second PMOS and a second NMOS. The first PMOS and the second PMOS share a doping region as a co-source terminal. The first NMOS and the second NMOS share a doping region as a co-source terminal. The third gate strip is disposed immediately adjacent to the second gate strip. The third gate strip is a co-gate terminal of a third PMOS and a third NMOS. The second PMOS and the third PMOS share a doping region as a co-drain terminal. The second NMOS and the third NMOS share a doping region as a co-drain terminal.

20 Claims, 9 Drawing Sheets

INPUT CIRCUIT OF A FLIP-FLOP AND ASSOCIATED MANUFACTURING METHOD

BACKGROUND

With the advanced process of semiconductor, the size of a semiconductor device decreases. Therefore, components occupying large area are undesired. However, for data storage, flip-flop circuits including dozens of transistors are frequently used in a device, which consumes a large area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
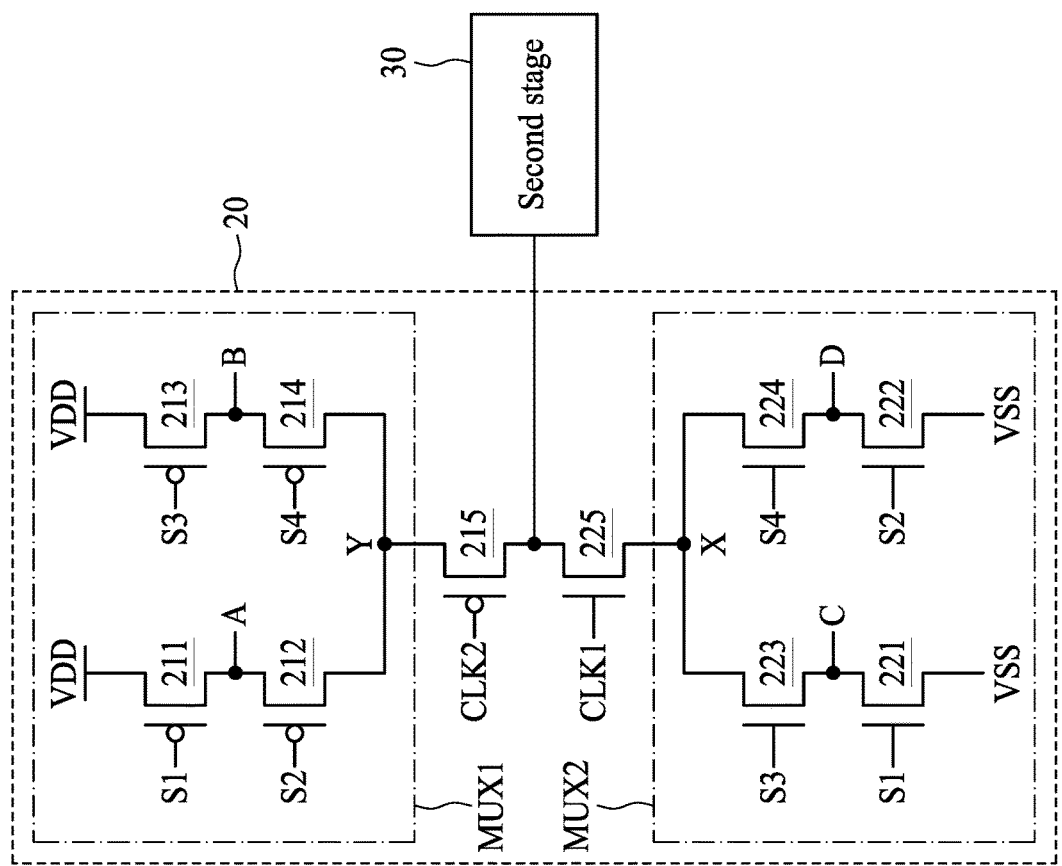
FIG. 1 is a diagram illustrating a flip-flop in accordance with an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Flip-flops are commonly used in a semiconductor device as data storage elements. A flip-flop is a device which stores a single bit of data; one of its two states represents a logical '1' and the other represents a logical '0'. Such data storage can be used for storage of state, and such a circuit is described as sequential logic in electronics. Flip-flops can be either simple (transparent or asynchronous) or clocked (synchronous), wherein the simple ones are commonly described as latches, while the clocked ones are described as flip-flops.

Flip-flops can be divided into common types such as SR (set-reset), D (delay), T (toggle) and JK, wherein each type can be implemented by couples of logic gates, and each logic gate can be implemented by couples of transistors. With such configurations, when a huge amount of flip-flops are used in a semiconductor device, a large area is consumed, which is not desired for designers. The present disclosure proposes an input circuit of a flip-flop and an associated manufacturing method to solve the aforementioned problem.

FIG. 1 is a diagram illustrating a flip-flop 10 in accordance with an embodiment of the present disclosure. In this embodiment, the flip-flop 10 includes an input circuit 20 as a first stage, and further includes a second stage 30 coupled to the input circuit 20. The input circuit 20 includes P-type Metal-Oxide-Semiconductor Field-Effect Transistors (MOSFETs), or so called PMOSs 211 to 215, and N-type MOSFETs, or so called NMOSs 221 to 225.

The PMOS 211 is coupled between a voltage source VDD and a terminal A. Specifically, the voltage source VDD is coupled to a source terminal of the PMOS 211, and the terminal A is coupled to a drain terminal of the PMOS 211.

Moreover, a signal S1 is directed to a gate terminal of the PMOS 211. The PMOS 212 is coupled between the terminal A and a terminal Y. Specifically, the terminal A is coupled to a drain terminal of the PMOS 212, and the terminal Y is coupled to a source terminal of the PMOS 212. Moreover, a signal S2 is directed to a gate terminal of the PMOS 212. Because the terminal A is coupled to the drain terminals of the PMOSs 211 and 212, the terminal A is configured to be a co-drain terminal of the PMOSs 211 and 212.

The PMOS 213 is coupled between the voltage source VDD and a terminal B. Specifically, the voltage source VDD is coupled to a source terminal of the PMOS 213, and the terminal B is coupled to a drain terminal of the PMOS 213, Moreover, a signal S3 is directed to a gate terminal of the PMOS 213. The PMOS 214 is coupled between the terminal B and a terminal Y. Specifically, the terminal B is coupled to a drain terminal of the PMOS 214, and the terminal Y is coupled to a source terminal of the PMOS 214. Moreover, a signal S4 is directed to a gate terminal of the PMOS 214. Because the terminal B is coupled to the drain terminals of the PMOSs 213 and 214, the terminal B is configured to be a co-drain terminal of the PMOSs 213 and 214. In addition, because the terminal Y is coupled to the source terminals of the PMOSs 212 and 214, the terminal Y is configured to be a co-source terminal of the PMOSs 212 and 214.

The PMOS 215 is coupled between the terminal Y and the NMOS 225. Specifically, the terminal Y is coupled to a source terminal of the PMOS 215, and a drain terminal of the NMOS 225 is coupled to the drain terminal of the PMOS 215. Moreover, a clock signal CLK2 is directed to a gate terminal of the PMOS 215. The NMOS 225 is coupled between the PMOS 21 and the terminal X. Specifically, the terminal X is coupled to a source terminal of the NMOS 225. Moreover, a clock signal CLK1 is directed to a gate terminal of the NMOS 225.

The NMOS is coupled between a voltage source VSS and a terminal C. Specifically, the voltage source VSS is coupled to a source terminal of the NMOS 221, and the terminal C is coupled to a drain terminal of the NMOS 221. Moreover, the signal S1 is directed to a gate terminal of the NMOS 221. The NMOS 223 is coupled between the terminal C and a terminal X. Specifically, the terminal C is coupled to a drain terminal of the NMOS 223, and the terminal X is coupled to a source terminal of the NMOS 223. Moreover, the signal S3 is directed to a gate terminal of the NMOS 223. Because the terminal C is coupled to the drain terminals of the NMOSs 221 and 223, the terminal C is configured to be a co-drain terminal of the NMOSs 221 and 223.

The NMOS 222 is coupled between the voltage source VSS and a terminal D. Specifically, the voltage source VSS is coupled to a source terminal of the NMOS 222, and the terminal D is coupled to a drain terminal of the NMOS 222. Moreover, the signal S2 is directed to a gate terminal of the NMOS 222. The NMOS 224 is coupled between the terminal 4 and the terminal X. Specifically, the terminal D is coupled to a drain terminal of the NMOS 224, and the terminal X is coupled to a source terminal of the NMOS 224. Moreover, the signal S4 is directed to a gate terminal of the NMOS 224. Because the terminal D is coupled to the drain terminals of the NMOSs 222 and 224, the terminal D is configured to be a co-drain terminal of the NMOSs 221 and 223. In addition, because the terminal X is coupled to the source terminals of the NMOSs 223 and 224, the terminal X is configured to be a co-source terminal of the NMOSs 223 and 224.

Those skilled in the art should understand that the source terminal and the drain terminal of a PMOS or an NMOS can be swapped. In addition, those skilled in the art should understand that the PMOSs 211 to 214 constitute a multiplexer which is denoted as MUX1 in FIG. 1, and the NMOSs 221 to 224 constitute a multiplexer which is denoted as MUX2 in FIG. 1. In practice, the multiplexers MUX1 and MUX2 are usually designed in the same cell, and the layout of the cell plays an important role for saving the area of input circuit 10.

Figure 2:
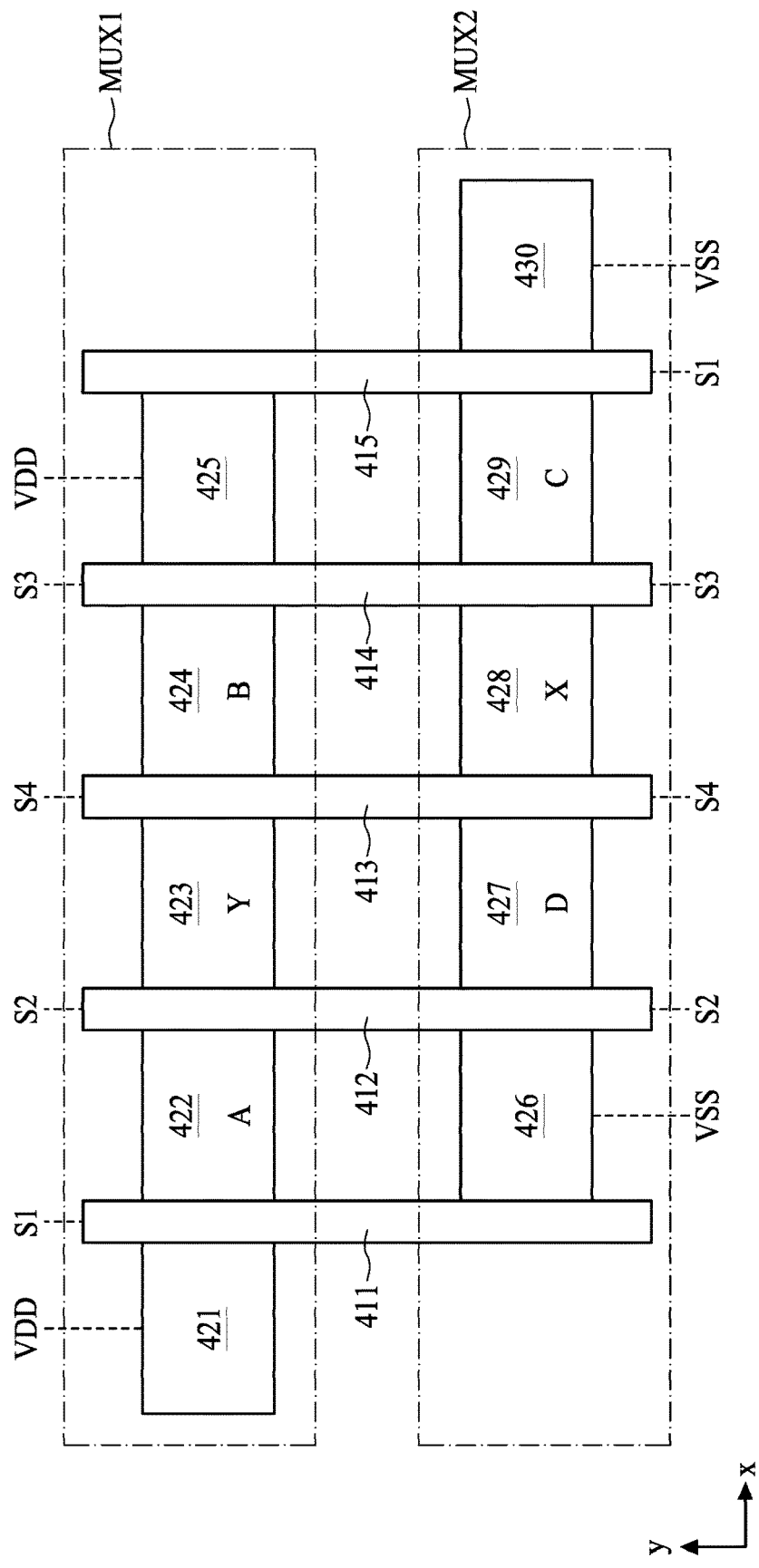
FIG. 2 is a diagram illustrating a layout of a cell in accordance with an embodiment of the present disclosure.

Refer to FIG. 2, which is a diagram illustrating a layout of a cell 40 in accordance with an embodiment of the present disclosure. The cell 40 represents a part of the input circuit 20. Particularly, the cell 40 includes the layout of the multiplexers MUX1 and MUX2 of the input circuit 20. The cell 40 includes gate strips 411, 412, 413, 414 and 415 configured to be gate terminals of transistors.

Specifically, the gate strip 412 extending in y direction is configured to be a co-gate terminal of the PMOS 212 and the NMOS 222, and the signal S2 is directed to the gate strip 412. Moreover, the gate strip 413 extending in y direction is configured to be a co-gate terminal of the PMOS 214 and the NMOS 224, and the signal S4 is directed to the gate strip 413. Furthermore, the gate strip 414 extending in y direction is configured to be a co-gate terminal of the PMOS 213 and the NMOS 223, and the signal S3 is directed to the gate strip 414. Besides, the gate strips 411 and 415 extending in y direction are configured to be a gate terminal of the PMOS 211 and a gate terminal of the NMOS 221, respectively, and the signal S1 is directed to the gate strips 411 and 415.

The cell 40 further includes doping regions 421 to 430. In this embodiment, the doping regions 421 to 425 are doped with p-type material while the doping regions 426 to 430 are doped with n-type material. With such configurations, the doping regions 421 to 425 are configured to be the source/drain terminals of PMOS, and the doping regions 426 to 430 are configured to be the source/drain terminals of NMOS.

Refer to FIG. 2 in conjunction with FIG. 1, the doping region 422 is configured to be the co-drain terminal A of the PMOSs 211 and 212, the doping region 423 is configured to be the co-source terminal Y of the PMOSs 212 and 214, and the doping region 424 is configured to be the co-drain terminal B of the PMOSs 213 and 214. The doping region 421 is configured to be the source terminal of the PMOS 211, and the doping region 425 is configured to be the source terminal of the PMOS 213.

In addition, the doping region 427 is configured to be the co-drain terminal D of the NMOSs 222 and 224, the doping region 428 is configured to be the co-source terminal X of the NMOSs 223 and 224, and the doping region 429 is configured to be the co-drain terminal C of the NMOSs 221 and 223. The doping region 426 is configured to be the source terminal of the NMOS 222, and the doping region 430 is configured to be the source terminal of the NMOS 221. In this embodiment, the voltage source VDD is directed to the doping regions 421 and 425, and the voltage source VSS is directed to the doping regions 426 and 430.

As shown in FIG. 2, the transistors in the multiplexers MUX1 and MUX2 share the gate strips 412, 413 and 414. Those skilled in the art should understand that the distance between two immediately adjacent gate strips are defined as a pitch, and the width of the cell 40 is only 6 pitches long, which save more area for the input circuit 20.

Figure 3:
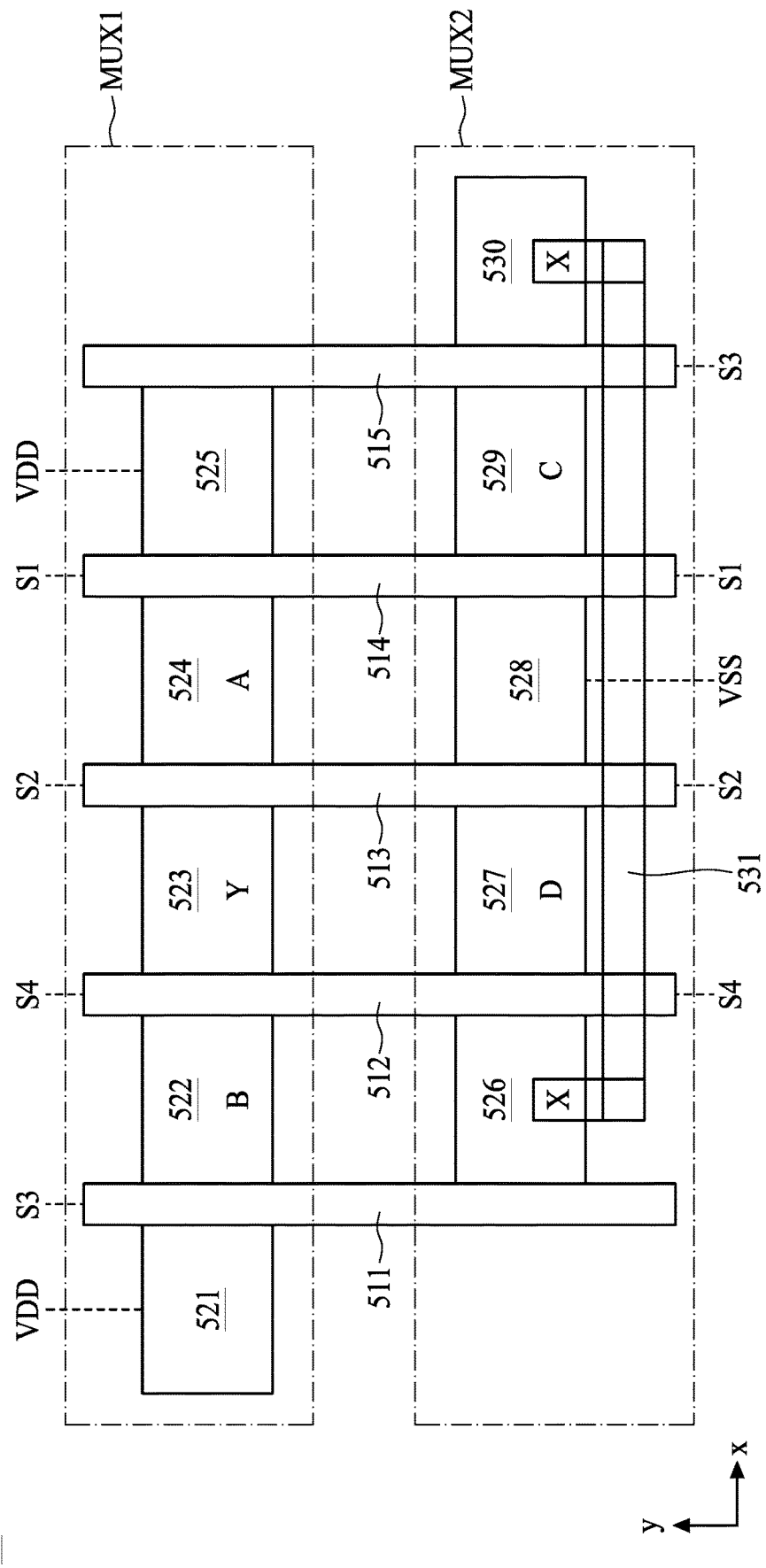
FIG. 3 is a diagram illustrating a layout of a cell in accordance with another embodiment of the present disclosure.

Refer to FIG. 3, which is a diagram illustrating a layout of a cell 50 in accordance with an embodiment of the present disclosure. The cell 50 represents a part of the input circuit 20. Particularly, the cell 50 includes the layout of the multiplexers MUM and MUX2 of the input circuit 20. The cell 50 includes gate strips 511, 512, 513, 514 and 515 configured to be gate terminals of transistors.

Specifically, the gate strip 512 extending in v direction is configured to be a co-gate terminal of the PMOS 214 and the NMOS 224, and the signal S4 is directed to the gate strip 512. Moreover, the gate strip 513 extending in y direction is configured to be a co-gate terminal of the PMOS 212 and the NMOS 2.22, and the signal S2 is directed to the gate strip 513. Furthermore, the gate strip 514 extending in y direction is configured to be a co-gate terminal of the PMOS 211 and the NMOS 221, and the signal S1 is directed to the gate strip 514. Besides, the gate strips 511 and 515 extending in y direction are configured to be a gate terminal of the PMOS 213 and a gate terminal of the NMOS 223, respectively, and the signal S3 is directed to the gate strips 511 and 515.

The cell 50 further includes doping regions 521 to 530. In this embodiment, the doping regions 521 to 525 are doped with p-type material e the doping regions 526 to 530 are doped with n-type material. With such configurations, the doping regions 521 to 525 are configured to be the source/drain terminals of PMOS, and the doping regions 526 to 530 are configured to be the source/drain terminals of NMOS.

Refer to FIG. 3 in conjunction with FIG. 1, the doping region 522 is configured to be the co-drain terminal B of the PMOSs 213 and 214; the doping region 523 is configured to be the co-source terminal Y of the PMOSs 212 and 214; and the doping region 524 is configured to be the co-drain terminal A of the PMOSs 211 and 212. The doping region 521 is configured to be the source terminal of the PMOS 213, and the doping region 525 is configured to be the source terminal of the PMOS 211.

In addition, the doping region 527 is configured to be the co-drain terminal D of the NMOSs 222 and 224; the doping region 528 is configured to be the source terminal of the NMOS 221 and in the meantime, to be the source terminal of the NMOS 222; and the doping region 529 is configured to be the co-drain terminal C of the NMOSs 221 and 223. The doping region 526 and the doping region 530 are the source terminals of the NMOSs 223 and 224, respectively. As mentioned in FIG. 1, the source terminal of the NMOSs 223 and 224 are connected to the terminal X. Therefore, the doping regions 526 and 530 are connected via a conductive line 531. The connected doping regions 526 and 530 are considered as the co-source terminal X. It should be noted that, the material or the location of the conductive line 531 are not limited by the present disclosure.

In this embodiment, the voltage source VDD is directed to the doping regions 521 and 525, and the voltage source VSS is directed to the doping region 528. As shown in FIG. 3, the transistors in the multiplexers MUX1 and MUX2 share the gate strips 512, 513 and 514. Therefore, the width of the cell 50 is only 6 pitches long, which save more area for the input circuit 20.

Figure 4:
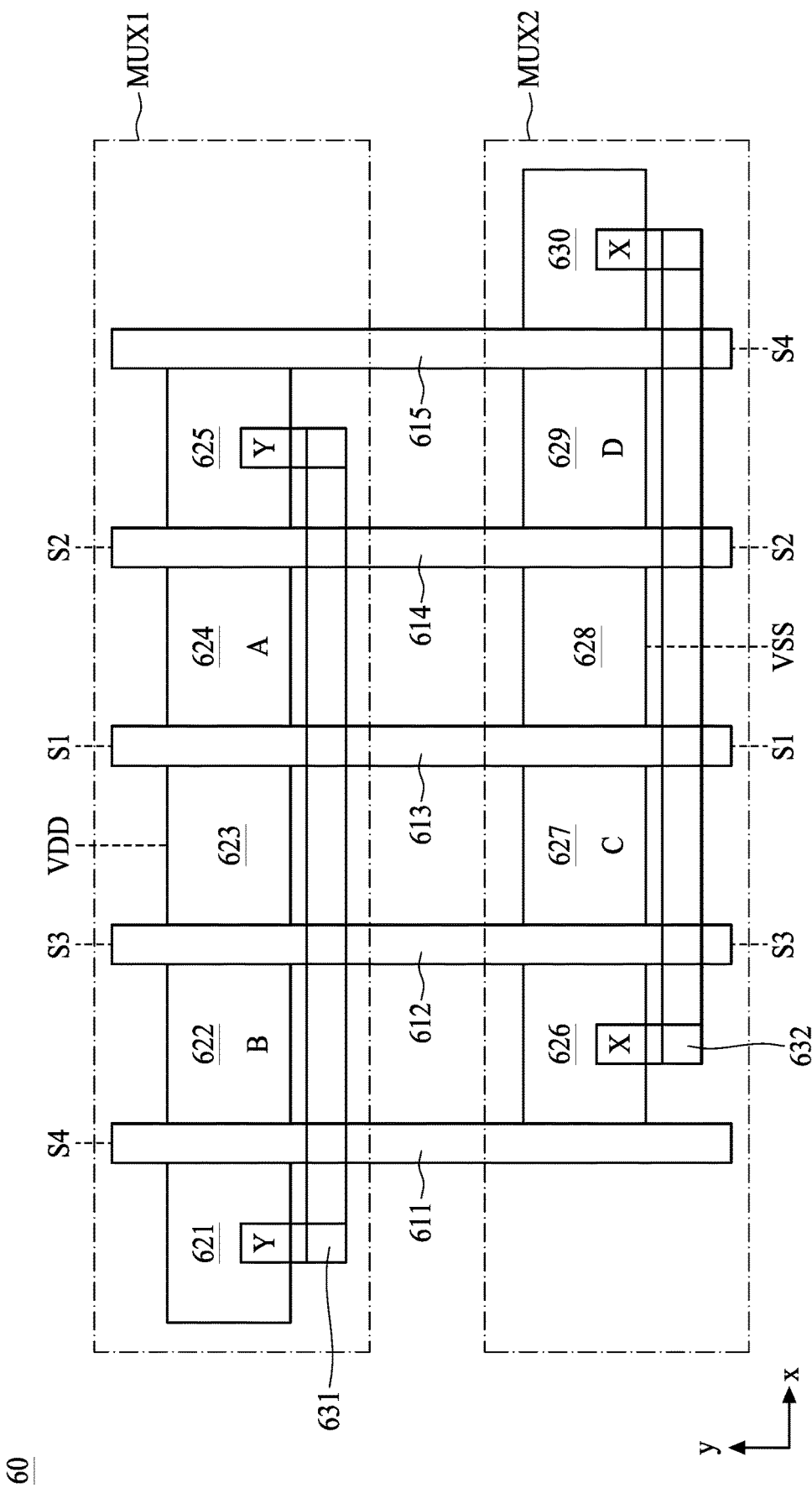
FIG. 4 is a diagram illustrating a layout of a cell in accordance with another embodiment of the present disclosure.

Refer to FIG. 4, which is a diagram illustrating a layout of a cell 60 in accordance with an embodiment of the present disclosure. The cell 60 represents a part of the input circuit 20. Particularly, the cell 60 includes the layout of the multiplexers MUX1 and MUX2 of the input circuit 20. The cell 60 includes gate strips 611, 612, 613, 614 and 615 configured to be gate terminals of transistors.

Specifically, the gate strip 612 extending in y direction is configured to be a co-gate terminal of the PMOS 213 and the NMOS 223, and the signal S3 is directed to the gate strip 612. Moreover, the gate strip 613 extending in y direction is configured to be a co-gate terminal of the PMOS 211 and the NMOS 221, and the signal S1 is directed to the gate strip 613. Furthermore, the gate strip 614 extending in y direction is configured to be a co-gate terminal of the PMOS 212 and the NMOS 222, and the signal S2 is directed to the gate strip 614. Besides, the gate strips 611 and 615 extending in y direction are configured to be a gate terminal of the PMOS 214 and a gate terminal of the NMOS 224, respectively, and the signal S4 is directed to the gate strips 611 and 615.

The cell 60 further includes doping regions 621 to 630. In this embodiment, the doping regions 621 to 625 are doped with p-type material e the doping regions 626 to 630 are doped with n-type material. With such configurations, the doping regions 621 to 625 are configured to be the source/drain terminals of PMOS, and the doping regions 626 to 630 are configured to be the source/drain terminals of NMOS.

Refer to FIG. 4 in conjunction with FIG. 1, the doping region 622 is configured to be the co-drain terminal B of the PMOSs 213 and 214; the doping region 623 is configured to be the source terminal of the PMOS 211 and in the meantime, to be the source terminal of the PMOS 213; and the doping region 624 is configured to be the co-drain terminal A of the PMOSs 211 and 212. The doping region 621 and the doping region 625 are configured to be the source terminals of the PMOSs 212 and 214, respectively. As mentioned in FIG. 1, the source terminal of the PMOSs 212 and 214 are connected to the terminal Y. Therefore, the doping regions 621 and 625 are connected via a conductive line 631. The connected doping regions 621 and 625 are considered as the co-source terminal Y. It should be noted that, the material or the location of the conductive line 631 are not limited by the present disclosure.

In addition, the doping region 627 is configured to be the co-drain terminal C of the NMOSs 221 and 223; the doping region 628 is configured to be the source terminal of the NMOS 221, and in the meantime, to be the source terminal of the NMOS 222; and the doping region 629 is configured to be the co-drain terminal D of the NMOSs 222 and 224. The doping region 626 and the doping region 630 are configured to be the source terminals of the NMOSs 223 and 224, respectively. As mentioned in FIG. 1, the source terminal of the NMOSs 223 and 224 are connected to the terminal X. Therefore, the doping regions 626 and 630 are connected via a conductive line 632. The connected doping regions 626 and 630 are considered as the co-source terminal X. It should be noted that, the material or the location of the conductive line 632 are not limited by the present disclosure.

In this embodiment, the voltage source VDD is directed to the doping region 623, and the voltage source VSS is directed to the doping region 628. As shown in FIG. 4, the transistors in the multiplexers MUX1 and MUX2 share the gate strips 612, 613 and 614. Therefore, the width of the cell 60 is only 6 pitches long, which save more area for the input circuit 20.

Figure 5:
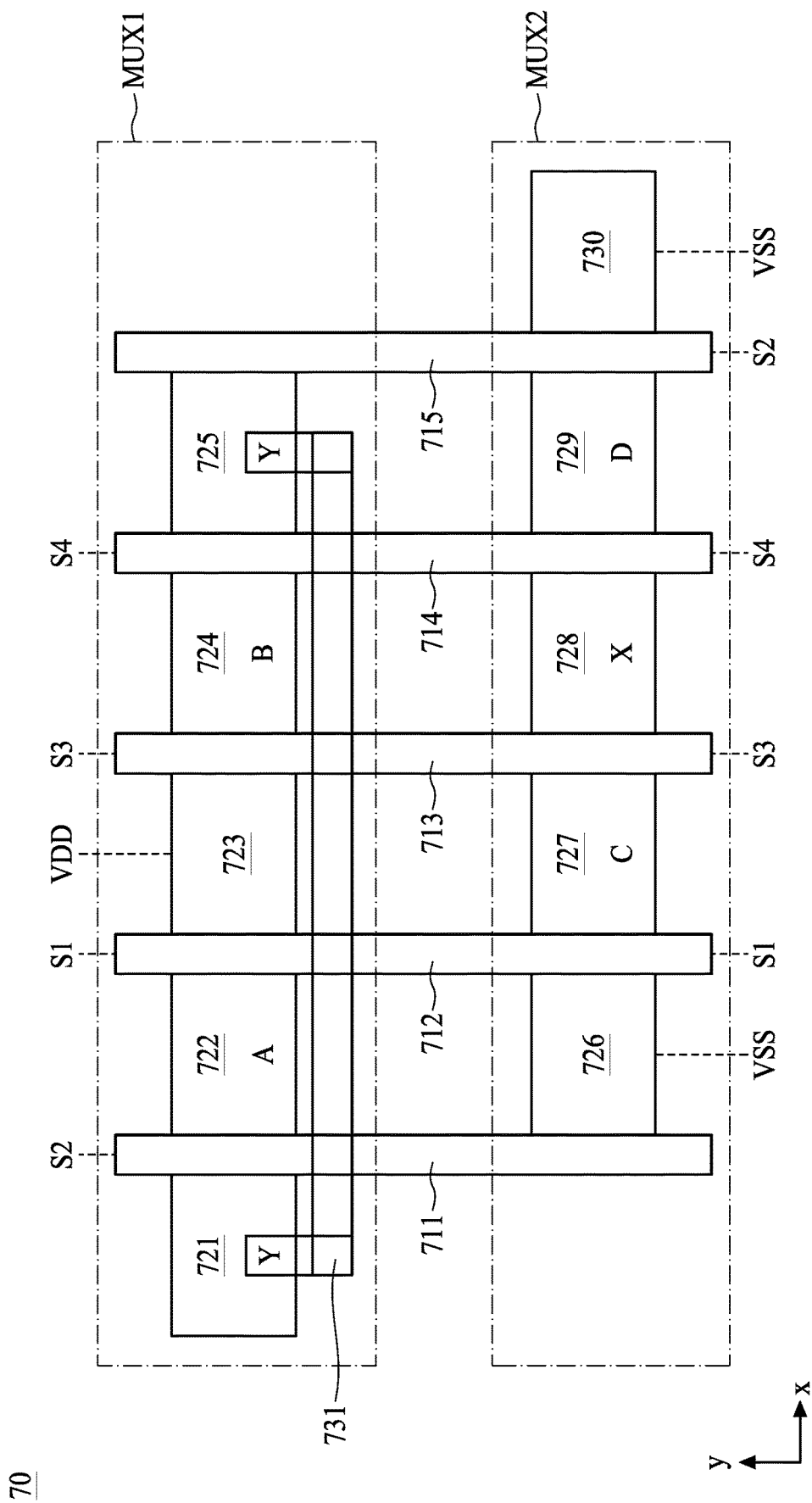
FIG. 5 is a diagram illustrating a layout of a cell in accordance with another embodiment of the present disclosure.

Refer to FIG. 5, which is a diagram illustrating a layout of a cell 70 in accordance with an embodiment of the present disclosure. The cell 70 represents a part of the input circuit 20. Particularly, the cell 70 includes the layout of the multiplexers MUX1 and MUX2 of the input circuit 20. The cell 70 includes gate strips 711, 712, 713, 714 and 715 configured to be gate terminals of transistors.

Specifically, the gate strip 712 extending in y direction is configured to be a co-gate terminal of the PMOS 211 and the NMOS 221, and the signal S1 is directed to the gate strip 712. Moreover, the gate strip 713 extending in y direction is configured to be a co-gate terminal of the PMOS 213 and the NMOS 223, and the signal S3 is directed to the gate strip 713. Furthermore, the gate strip 714 extending in y direction is configured to be a co-gate terminal of the PMOS 214 and the NMOS 224, and the signal S4 is directed to the gate strip 714. Besides, the gate strips 711 and 715 extending in y direction are configured to be a gate terminal of the PMOS 212 and a gate terminal of the NMOS 222, respectively, and the signal S2 is directed to the gate strips 711 and 715.

The cell 70 further includes doping regions 721 to 730. In this embodiment, the doping regions 721 to 725 are doped with p-type material while the doping regions 726 to 730 are doped with n-type material. With such configurations, the doping regions 721 to 725 are configured to be the source/drain terminals of PMOS, and the doping regions 726 to 730 are configured to be the source/drain terminals of NMOS.

Refer to FIG. 5 in conjunction with FIG. 1, the doping region 722 is configured to be the co-drain terminal A of the PMOSs 211 and 212; the doping region 723 is configured to be the source terminal of the PMOS 211 and in the meantime, to be the source terminal of the PMOS 213; and the doping region 724 is configured to be the co-drain terminal B of the PMOSs 213 and 214. The doping region 721 and the doping region 725 are configured to be the source terminals of the PMOSs 212 and 214, respectively. As mentioned in FIG. 1, the source terminal of the PMOSs 212 and 214 are connected to the terminal Y. Therefore, the doping regions 721 and 725 are connected via a conductive line 731. The connected doping regions 721 and 725 are considered as the co-source terminal Y. It should be noted that, the material or the location of the conductive line 731 are not limited by the present disclosure.

In addition, the doping region 727 is configured to be the co-drain terminal C of the NMOSs 221 and 223; the doping region 728 is configured to be the co-source terminal X of the NMOSs 223 and 224; and the doping region 729 is configured to be the co-drain terminal D of the NMOSs 222 and 224. The doping region 726 is configured to be the source terminal of the NMOS 221, and the doping region 730 is configured to be the source terminal of the NMOS 222. In this embodiment, the voltage source VDD is directed to the doping region 723, and the voltage source VSS is directed to the doping regions 726 and 730.

As shown in FIG. 5, the transistors in the multiplexers MUX1 and MUX2 share the gate strips 712, 713 and 714. Therefore, the width of the cell 70 is only 6 pitches long, which save more area for the input circuit 20.

Figure 6:
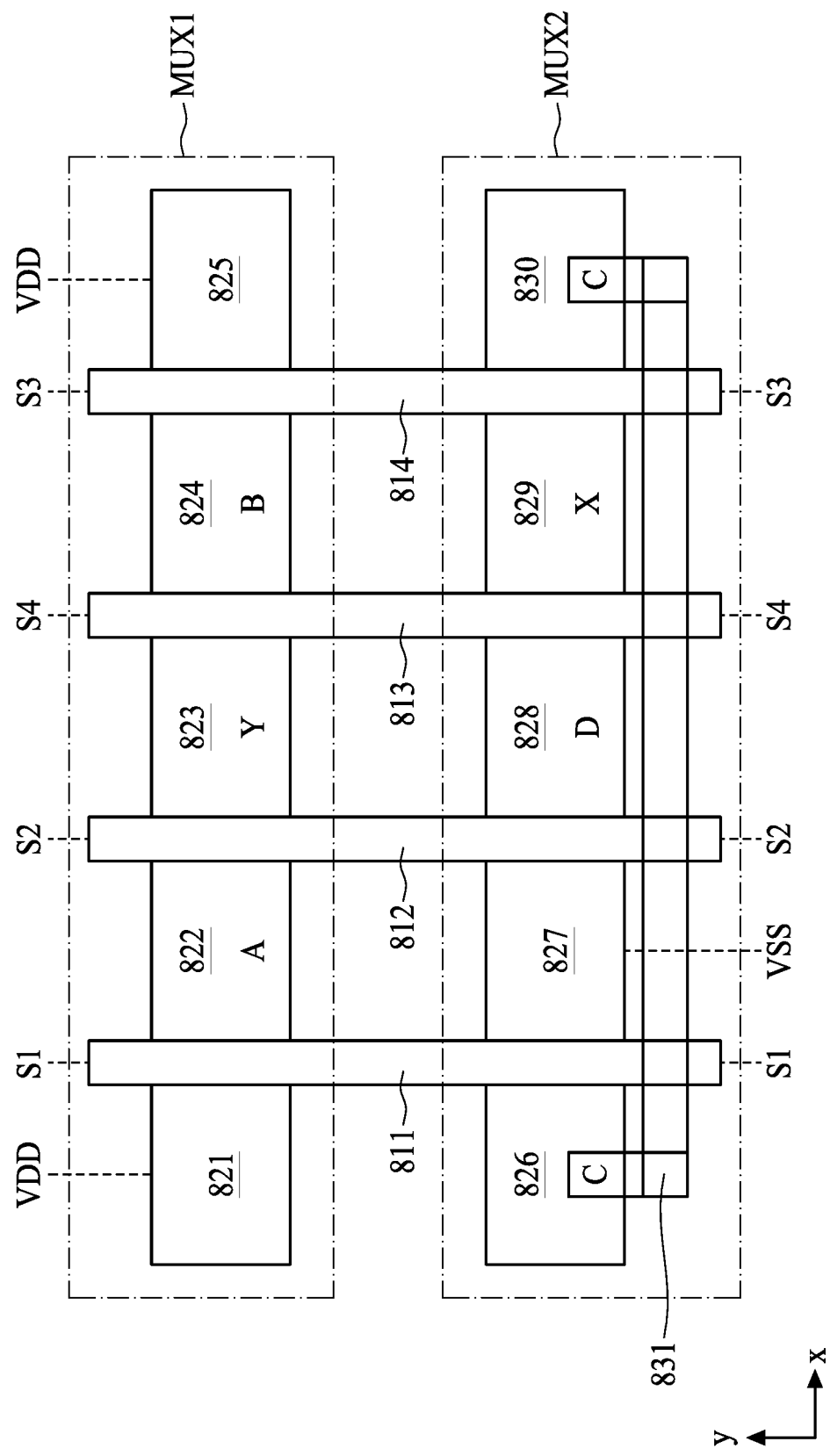
FIG. 6 is a diagram illustrating a layout of a cell in accordance with another embodiment of the present disclosure.

Refer to FIG. 6, which is a diagram illustrating a layout of a cell 80 in accordance with an embodiment of the present disclosure. The cell 80 represents a part of the input circuit 20. Particularly, the cell 80 includes the layout of the multiplexers MUX1 and MUX2 of the input circuit 20. The cell 80 includes gate strips 811, 812, 813, and 814 configured to be gate terminals of transistors.

Specifically, the gate strip 811 extending in y direction is configured to be a co-gate terminal of the PMOS 211 and the NMOS 221, and the signal S1 is directed to the gate strip 811. Moreover, the gate strip 812 extending in y direction is configured to be a co-gate terminal of the PMOS 212 and the NMOS 222, and the signal S2 is directed to the gate strip 812. Furthermore, the gate strip 813 extending in y direction is configured to be a co-gate terminal of the PMOS 214 and the NMOS 224, and the signal S4 is directed to the gate strip 813. In addition, the gate strip 814 extending in y direction is configured to be a co-gate terminal of the PMOS 213 and the NMOS 223, and the signal S3 is directed to the gate strip 814.

The cell 80 further includes doping regions 821 to 830. In this embodiment, the doping regions 821 to 825 are doped with p-type material while the doping regions 826 to 830 are doped with n-type material. With such configurations, the doping regions 821 to 825 are configured to be the source/drain terminals of PMOS, and the doping regions 826 to 830 are configured to be the source/drain terminals of NMOS.

Refer to FIG. 6 in conjunction with FIG. 1, the doping region 822 is configured to be the co-drain terminal A of the PMOSs 211 and 212; the doping region 823 is configured to be the co-source terminal Y of the PMOSs 212 and 214; and the doping region 824 is configured to be the co-drain terminal B of the PMOSs 213 and 214. The doping region 821 is configured to be the source terminal of the PMOS 211, and the doping region 825 is configured to be the source terminals of the PMOS 213.

In addition, the doping region 827 is configured to be the source terminal of the NMOS 221, and in the meantime, to be the source terminal of the NMOS 222; the doping region 828 is configured to be the co-drain terminal D of the NMOSs 222 and 224; and the doping region 829 is configured to be the co-source terminal X of the NMOSs 223 and 224. The doping region 826 and the doping region 830 are configured to be the drain terminals of the NMOSs 221 and 223, respectively. As mentioned in FIG. 1, the drain terminal of the NMOSs 221 and 223 are connected to the terminal C. Therefore, the doping regions 826 and 830 are connected via a conductive line 831. The connected doping regions 826 and 830 are considered as the co-source terminal C. It should be noted that, the material or the location of the conductive line 831 are not limited by the present disclosure.

In this embodiment, the voltage source VDD is directed to the doping regions 821 and 825, and the voltage source VSS is directed to the doping region 827. As shown in FIG. 6, the transistors in the multiplexers MUX1 and MUX2 share the gate strips 811, 812, 813 and 814. Therefore, the width of the cell 80 is only 5 pitches long, which save more area for the input circuit 20.

Figure 7:
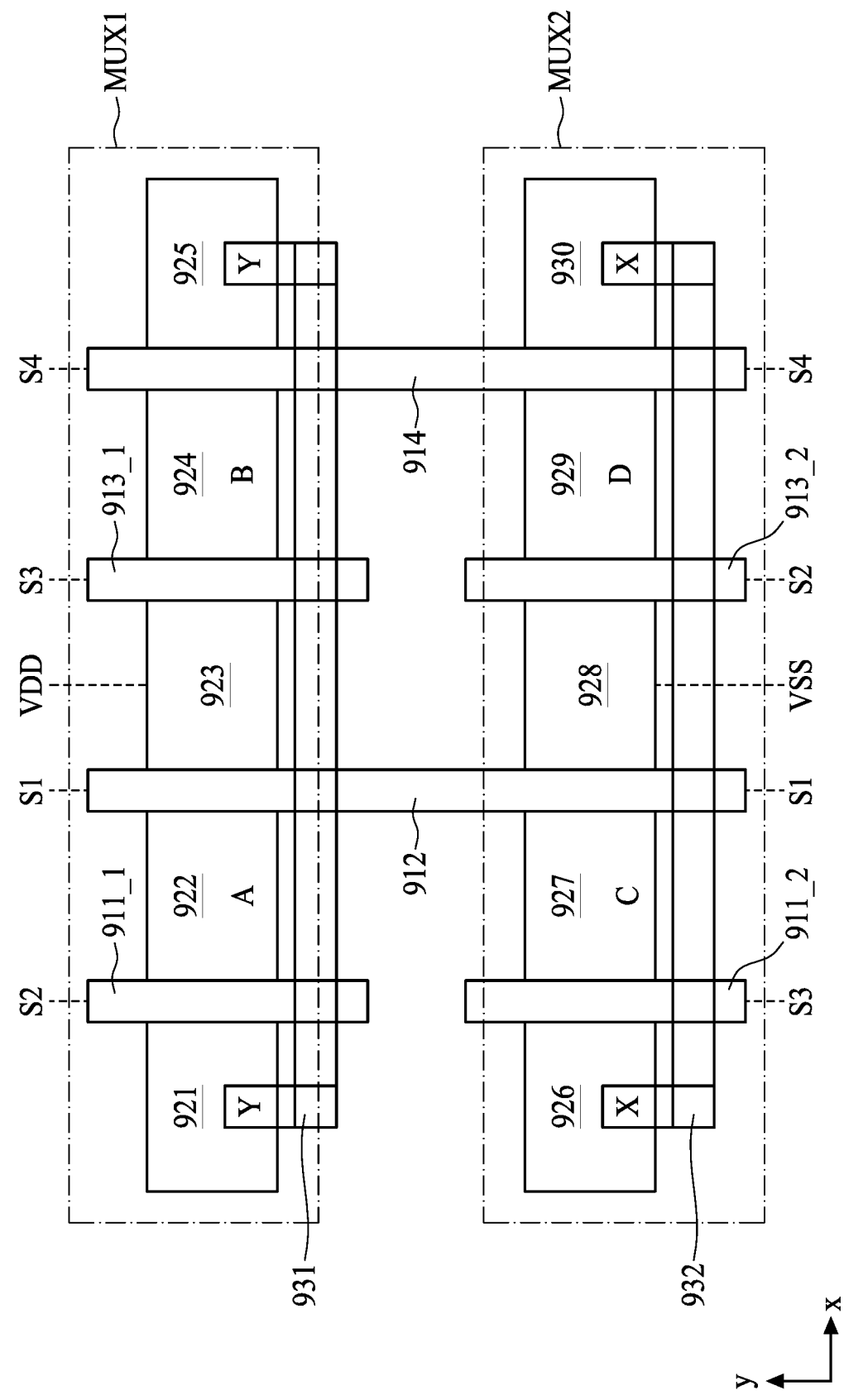
FIG. 7 is a diagram illustrating a layout of a cell in accordance with another embodiment of the present disclosure.

Refer to FIG. 7, which is a diagram illustrating a layout of a cell 90 in accordance with an embodiment of the present disclosure. The cell 90 represents a part of the input circuit 20. Particularly, the cell 90 includes the layout of the multiplexers MUX1 and MUX2 of the input circuit 20. The cell 90 includes gate strips 911_1, 911_2, 912, 913_1, 913_2 and 914 configured to be gate terminals of transistors. The gate strips 911_1 and 911_2 extending and arranged in y direction can be formed by executing a cut-off operation upon a gate strip to generate two halves of gate strip. Likewise, the gate strips 913_1 and 913_2 extending and arranged in y direction can be formed by executing a cut-off operation upon a gate strip to generate two halves of gate strip.

Specifically, the gate strip 911_1 extending in y direction is configured to be a gate terminal of the PMOS 212, and the signal S2 is directed to the gate strip 911_1. Moreover, the gate strip 912 extending in y direction is configured to be a co-gate terminal of the PMOS 211 and the NMOS 221, and the signal S1 is directed to the gate strip 912. Furthermore, the gate strip 913_1 extending in v direction is configured to be a gate terminal of the PMOS 213, and the signal S3 is directed to the gate strip 913_1. In addition, the gate strip 914 extending in y direction is configured to be a co-gate terminal of the PMOS 214 and the NMOS 224, and the signal S4 is directed to the gate strip 914.

On the other hand, the gate strip 911_2 is configured to be the gate terminal of the NMOS 223, and the signal S3 is directed to the gate strip 911_2. Moreover, the gate strip 913_2 is configured to be the gate terminal of the NMOS 222, and the signal S2 is directed to the gate strip 913_2.

The cell 90 further includes doping regions 921 to 930. In this embodiment, the doping regions 921 to 925 are doped with p-type material while the doping regions 926 to 930 are doped with n-type material. With such configurations, the doping regions 921 to 925 are configured to be the source/drain terminals of PMOS, and the doping regions 926 to 930 are configured to be the source/drain terminals of NMOS.

Refer to FIG. 7 in conjunction with FIG. 1, the doping region 922 is configured to be the co-drain terminal A of the PMOSs 211 and 212; the doping region 923 is configured to be the source terminal of the PMOS 211, and in the meantime, to be the source terminal of the PMOS 213; and the doping region 924 is configured to be the co-drain terminal B of the PMOSs 213 and 214. The doping region 921 and the doping region 925 are configured to be the source terminals of the PMOS 212 and 214, respectively. As mentioned in FIG. 1, the source terminals of the PMOSs 212 and 214 are connected to the terminal Y. Therefore, the doping regions 921 and 925 are connected via a conductive line 931. The connected doping regions 921 and 925 are considered as the co-source terminal Y. It should be noted that, the material or the location of the conductive line 931 are not limited by the present disclosure.

In addition, the doping region 927 is configured to be the co-drain terminal C of the NMOSs 221 and 223; the doping region 928 is configured to be the source terminal of the NMOS 221, and in the meantime, to be the source terminal of the NMOS 222; and the doping region 929 is configured to be the co-drain terminal D of the NMOSs 222 and 224. The doping region 926 and the doping region 930 are configured to be the source terminals of the NMOSs 223 and 224, respectively. As mentioned in FIG. 1, the source terminals of the NMOSs 223 and 224 are connected to the terminal X. Therefore, the doping regions 926 and 930 are connected via a conductive line 932. The connected doping regions 926 and 930 are considered as the co-source terminal X. It should be noted that, the material or the location of the conductive line 932 are not limited by the present disclosure.

Those skilled in the art should readily understand that there can be another conductive line connected between the gate strip 911_1 and the gate strip 913_2, to which the signal S2 is directed. Likewise, there can be another conductive line connected between the gate strip 911_2 and the gate strip 913_1, to which the signal S3 is directed In this embodiment, the voltage source VDD is directed to the doping region 923, and the voltage source VSS is directed to the doping region 928. As shown in FIG. 7, the transistors in the multiplexers MUX1 and MUX2 share the gate strips 912 and 914. In addition, the cut-off operation is executed to generate the gate strip 911_1 and 911_2 which carry different signals, and the gate strip 913_1 and 913_2 which carry different signals. Therefore, the width of the cell 90 is only 5 pitches long, which save more area for the input circuit 20.

Figure 8:
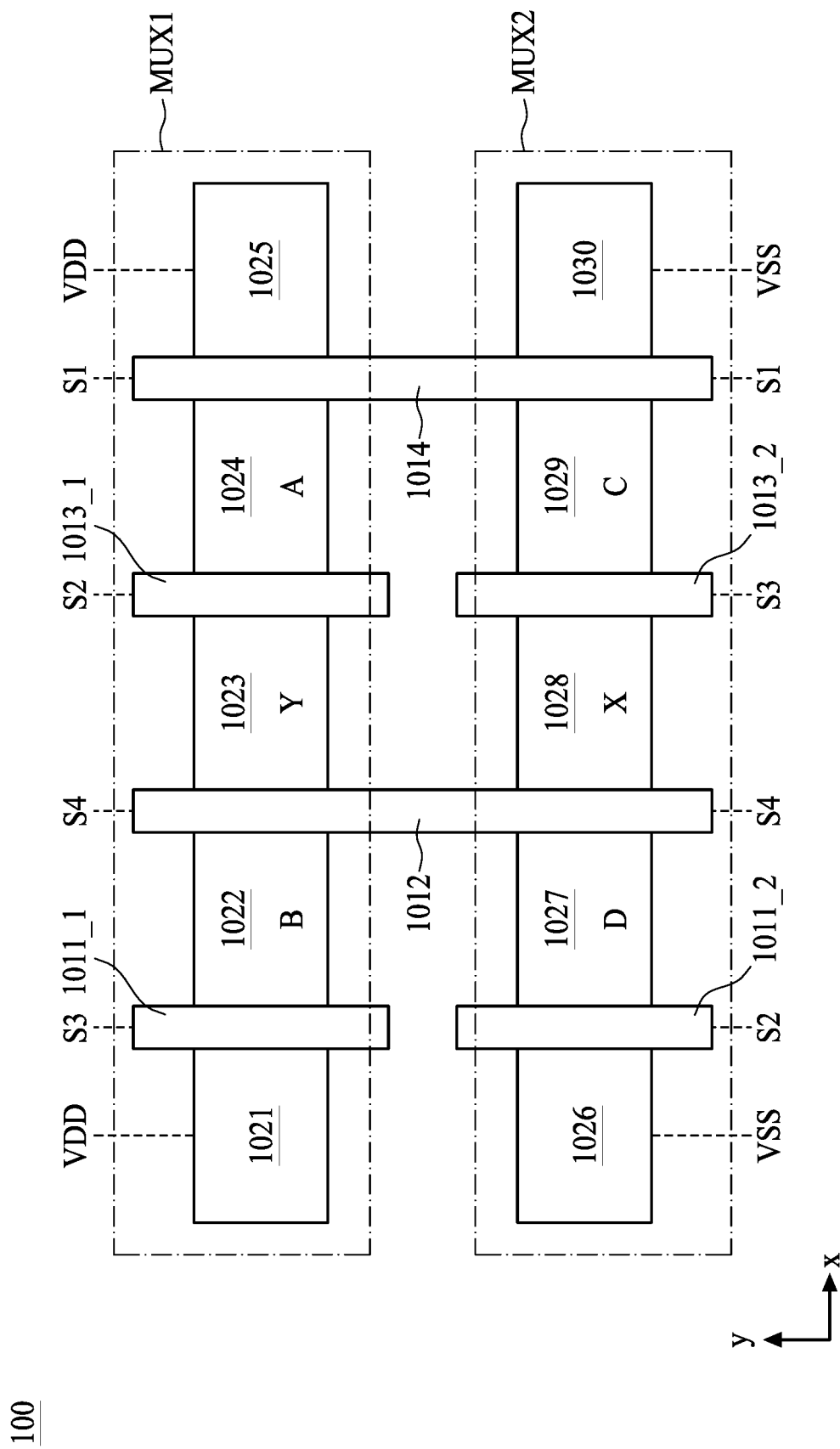
FIG. 8 is a diagram illustrating a layout of a cell in accordance with yet another embodiment of the present disclosure.

Refer to FIG. 8, which is a diagram illustrating a layout of a cell 100 in accordance with an embodiment of the present disclosure. The cell 100 represents a part of the input circuit 20. Particularly, the cell 100 includes the layout of the multiplexers MUX1 and MUX2 of the input circuit 20. The cell 100 includes gate strips 1011_1, 1011_2, 1012, 1013_1, 1013_2 and 1014 configured to be gate terminals of transistors. The gate strips 1011_1 and 1011_2 extending and arranged in y direction can be formed by executing a cut-off operation upon a gate strip to generate two halves of gate strip. Likewise, the gate strips 1013_1 and 1013_2 extending and arranged in y direction can be formed by executing a cut-off operation upon a gate strip to generate two halves of gate strip.

Specifically, the gate strip 1011_1 extending in y direction is configured to be a gate terminal of the PMOS 213, and the signal S3 is directed to the gate strip 1011_1. Moreover, the gate strip 1012 extending in y direction is configured to be a co-gate terminal of the PMOS 214 and the NMOS 224, and the signal S4 is directed to the gate strip 1012. Furthermore, the gate strip 1013_1 extending in y direction is configured to be a gate terminal of the PMOS 212, and the signal S2 is directed to the gate strip 1013_1. In addition, the gate strip 1014 extending in y direction is configured to be a co-gate terminal of the PMOS 211 and the NMOS 221, and the signal S1 is directed to the gate strip 1014.

On the other hand, the gate strip 1011_2 is configured to be the gate terminal of the NMOS 222, and the signal S2 is directed to the gate strip 1011_2. Moreover, the gate strip 1013_2 is configured to be the gate terminal of the NMOS 223, and the signal S3 is directed to the gate strip 1013_2.

The cell 100 further includes doping regions 1021 to 1030. In this embodiment, the doping regions 1021 to 1025 are doped with p-type material while the doping regions 1026 to 1030 are doped with n-type material. With such configurations, the doping regions 1021 to 1025 are configured to be the source/drain terminals of PMOS, and the doping regions 1026 to 1030 are configured to be the source/drain terminals of NMOS.

Refer to FIG. 8 in conjunction with FIG. 1, the doping region 1022 is configured to be the co-drain terminal B of the PMOSs 213 and 214; the doping region 1023 is configured to be the co-source terminal Y of the PMOSs 212 and 214; and the doping region 1024 is configured to be the co-drain terminal A of the PMOSs 211 and 212. The doping region 1021 and the doping region 1025 are configured to be the source terminals of the PMOS 213 and 211, respectively.

In addition, the doping region 1027 is configured to be the co-drain terminal D of the NMOSs 222 and 224; the doping region 1028 is configured to be the co-source terminal X of the NMOSs 223 and 224; and the doping region 1029 is configured to be the co-drain terminal C of the NMOSs 221 and 223. The doping region 1026 and the doping region 1030 are configured to be the source terminals of the NMOSs 221 and 222, respectively.

Those skilled in the art should readily understand that there can be another conductive line connected between the gate strip 1011_1 and the gate strip 1013_2, to which the signal S2 is directed. Likewise, there can be another conductive line connected between the gate strip 1011_2 and the gate strip 1013_1, to which the signal S3 is directed In this embodiment, the voltage source VDD is directed to the doping regions 1021 and 1025, and the voltage source VSS is directed to the doping regions 1026 and 1030. As shown in FIG. 8, the transistors in the multiplexers MUX1 and MUX2 share the gate strips 1012 and 1014. In addition, the cut-off operation is executed to generate the gate strip 1011_1 and 1011_2 which carry different signals, and the gate strip 1013_1 and 1013_2 which carry different signals. Therefore, the width of the cell 100 is only 5 pitches long, which save more area for the input circuit 20.

Figure 9:
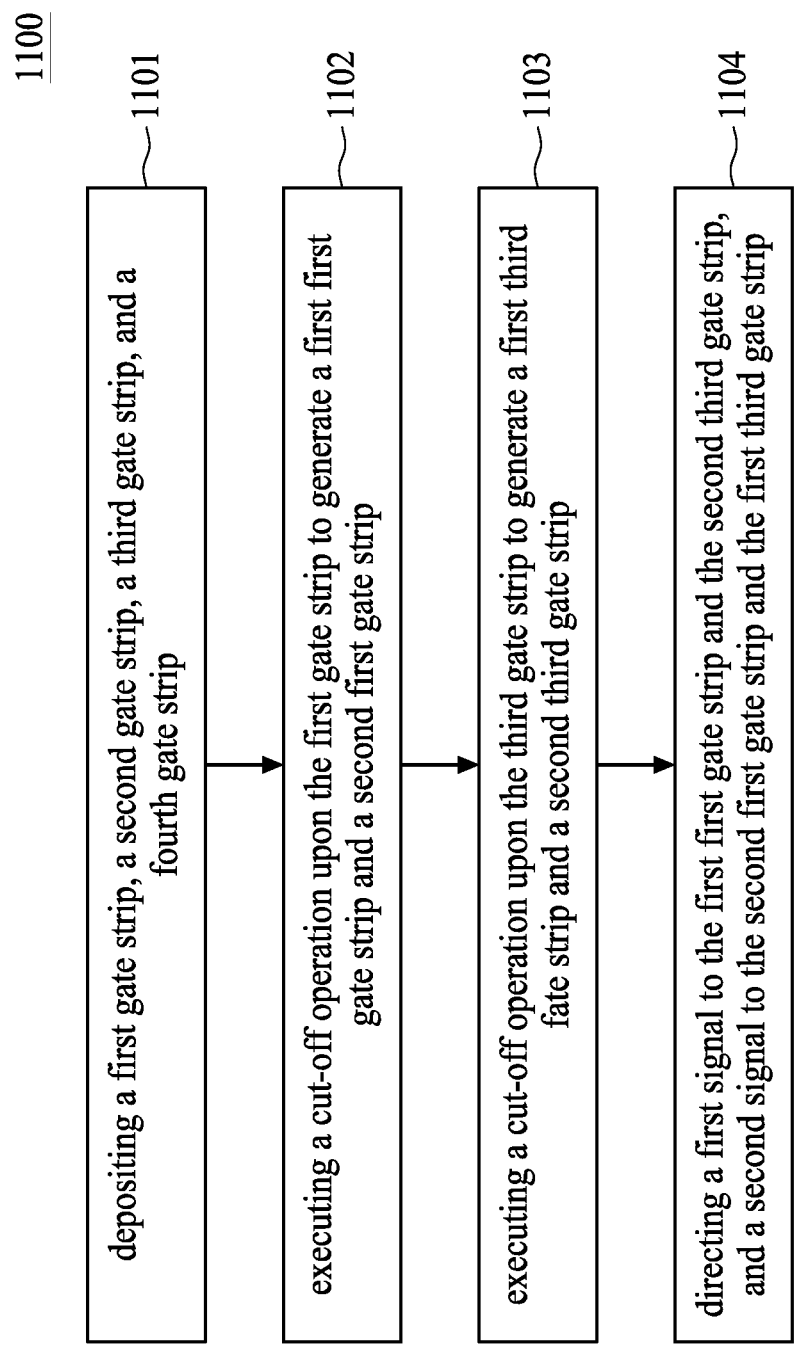
FIG. 9 is a flowchart illustrating a manufacturing method of an input circuit of a flip-flop in accordance with an embodiment of the present disclosure.

FIG. 9 is a flowchart illustrating the manufacturing method 1100 of the multiplexers MUX1 and MUX2 in accordance with an embodiment of the present disclosure. In this embodiment, the manufacturing method 1100 can be used to manufacture the cell 90 or 100 in the aforementioned embodiments. Provided that the results are substantially the same, the operations shown in FIG. 9 are not required to be executed in the exact order. The method 1100 is summarized as follows.

Operation 1101: a first gate strip, a second gate strip, a third gate strip, and a fourth gate strip are deposited.

In this operation, a distance between the first gate strip and the second gate strip, a distance between the second gate strip and the third gate strip, and a distance between the third gate strip and the fourth gate strip equal.

Operation 1102: a cut-off operation is executed upon the first gate strip to generate a first first gate strip and a second first gate strip. In this operation, the first first gate strip is a gate terminal of a first PMOS, and the second first gate strip is a gate terminal of a first NMOS;

Operation 1103: a cut-off operation is executed upon the third gate strip to generate a first third fate strip and a second third gate strip. In this operation, the first third gate strip is a gate terminal of a second PMOS and the second third gate strip is a gate terminal of a second NMOS.

Operation 1104: a first signal is directed to the first first gate strip and the second third gate strip, and a second signal is directed to the second first gate strip and the first third gate strip.

Those skilled in the art should readily understand the manufacturing method 1100 after reading the embodiments of FIGS. 7 and 8, the detailed description is omitted here for brevity.

In some embodiments, an input circuit of a flip-flop is disclosed. The input circuit includes a first gate strip, a second gate strip and a third gate strip. The first gate strip is configured to be a co-gate terminal of a first PMOS and a first NMOS; the second gate strip is disposed immediately adjacent to the first gate strip, and configured to be a co-gate terminal of a second PMOS and a second NMOS. The first PMOS and the second PMOS share a doping region as a co-source terminal, and the first NMOS and the second NMOS share a doping region as a co-source terminal. The third gate strip is disposed immediately adjacent to the second gate strip, wherein the third gate strip is configured to be a co-gate terminal of a third PMOS and a third NMOS. The second PMOS and the third PMOS share a doping region as a co-drain terminal, and the second NMOS and the third NMOS share a doping region as a co-drain terminal.

In some embodiments, an input circuit of a flip-flop is disclosed. The input circuit includes a first first gate strip, a second first gate strip, a first third gate strip, a second third gate strip, and a fourth gate strip. The first first gate strip extends in a first direction, and is configured to be a gate terminal of a first PMOS. The second first gate strip extends in the first direction, wherein the first first gate strip and the second first gate strip are arranged in the first direction and the second first gate strip is configured to be a gate terminal of a first NMOS. The second gate strip is disposed immediately adjacent to the first first gate strip and the second first gate strip, wherein the second gate strip is configured to be a co-gate terminal of a second PMOS and a second NMOS. The first PMOS and the second. PMOS share a doping region as a co-drain terminal, and the first NMOS and the second NMOS share a doping region as a co-drain terminal. The first third gate strip extends in the first direction, wherein the first third gate strip is disposed immediately adjacent to the second gate strip and configured to be a gate terminal of a third PMOS, and the second PMOS and the third PMOS share a doping region as a co-source terminal. The second third gate strip extends in the first direction, wherein the first third gate strip and the second third gate strip are arranged in the first direction. The second third gate strip is disposed immediately adjacent to the second gate strip and configured to be a gate terminal of the third NMOS, and the second NMOS and the third NMOS share a doping region as a co-source terminal. The fourth gate strip is disposed immediately adjacent to the first third gate strip and the second third gate strip, wherein the fourth gate strip is configured to be a co-gate terminal of the fourth PMOS and a fourth NMOS. The third PMOS and the fourth PMOS share a doping region as a co-drain terminal, and the third NMOS and the fourth NMOs share a doping region as a co-drain terminal.

In some embodiments, a manufacturing method of an input circuit of a flip-flop is disclosed. The method includes depositing a first gate strip, a second gate strip, a third gate strip, and a fourth gate strip, wherein a distance between the first gate strip and the second gate strip, a distance between the second gate strip and the third gate strip, and a distance between the third a strip and the fourth gate strip equal; executing a cut-off operation upon the first gate strip to generate a first first gate strip and a second first gate strip, wherein the first first gate strip is a gate terminal of a first PMOS, and the second first gate strip is a gate terminal of a first NMOS; executing a cut-off operation upon the third gate strip to generate a first third fate strip and a second third gate strip, wherein the first third gate strip is a gate terminal of a second PMOS and the second third gate strip is a gate terminal of a second NMOS; and directing a first signal to the first first gate strip and the second third gate strip, and a second signal to the second first gate strip and the first third gate strip.

What is claimed is:

1. An input circuit of a flip-flop, comprising:
a first gate strip, wherein the first gate strip is configured to be a co-gate terminal of a first PMOS and a first NMOS;
a second gate strip, disposed immediately adjacent to the first gate strip, wherein the second gate strip is configured to be a co-gate terminal of a second PMOS and a second NMOS, the first PMOS and the second PMOS share a doping region as a co-source terminal, and the first NMOs and the second NMOS share a doping region as a co-source terminal; and
a third gate strip, disposed immediately adjacent to the second gate strip, wherein the third gate strip is configured to be a co-gate terminal of a third PMOS and a third NMOS, the second PMOS and the third PMOS share a doping region as a co-drain terminal, and the second NMOS and the third NMOS share a doping region as a co-drain terminal.

2. The input circuit of claim 1, further comprising:
a fourth gate strip, disposed immediately adjacent to the first gate strip, wherein the fourth gate strip is configured to be a gate terminal of a fourth PMOS, and the first PMOS and the fourth PMOS share a doping region as a co-drain terminal; and
a fifth gate strip, disposed immediately adjacent to the third gate strip, wherein the fifth gate strip is configured to be a gate terminal of a fourth NMOS, and the third NMOS and the fourth NMOS share a doping region as a co-source terminal.

3. The input circuit of claim 2, wherein a source terminal of the third PMOS and a source terminal of the fourth PMOS are directed to a first voltage source.

4. The input circuit of claim 3, wherein a source terminal of the first NMOS and a source terminal of the fourth NMOS are directed to a second voltage source.

5. The input circuit of claim 3, wherein the co-source terminal of the second NMOS and the third NMOS is directed to a second voltage source.

6. The input circuit of claim 2, wherein the co-source terminal of the first PMOS and the second PMOS is directed to a first voltage source.

7. The input circuit of claim 6, wherein a source terminal of the first NMOS and a source terminal of the fourth NMOS are directed to a second voltage source.

8. The input circuit of claim 6, wherein the co-source terminal of the second NMOS and the third NMOS is directed to a second voltage source.

9. The input circuit of claim 1, further comprising:
a fourth gate strip, disposed immediately adjacent to the first gate strip, wherein the fourth gate strip is configured to be a co-gate terminal of a fourth PMOS and a fourth NMOS, the first PMOS and the fourth PMOS share a doping region as a co-drain terminal, and the first NMOS and the fourth NMOS share a doping region as a co-source terminal.

10. The input circuit of claim 9, wherein a source terminal of the third PMOS and a source terminal of the fourth PMOS are directed to a first voltage source, and the co-source terminal of the first NMOS and the fourth NMOS is directed to a second voltage source.

11. The input circuit of claim 10, wherein a drain terminal of the third NMOS is connected to a drain terminal of the fourth NMOS.

12. An input circuit of a flip flop, comprising:
a first first gate strip, extending in a first direction, wherein the first first gate strip is configured to be a gate terminal of a first PMOS,
a second first gate strip, extending in the first direction, wherein the first first gate strip and the second first gate strip are arranged in the first direction, and the second first gate strip is configured to be a gate terminal of a first NMOS;
a second gate strip, disposed immediately adjacent to the first first gate strip and the second first gate strip, wherein the second gate strip is configured to be a co-gate terminal of a second PMOS and a second NMOS, the first PMOS and the second PMOS share a doping region as a co-drain terminal, and the first NMOS and the second NMOS share a doping region as a co-drain terminal;
a first third gate strip, extending in the first direction, wherein the first third gate strip is disposed immediately adjacent to the second gate strip and configured to be a gate terminal of a third PMOS, and the second PMOS and the third PMOS share a doping region as a co-source terminal;
a second third gate strip, extending in the first direction, wherein the first third gate strip and the second third gate strip are arranged in the first direction, the second third gate strip is disposed immediately adjacent to the second gate strip and configured to be a gate terminal of the third NMOS, and the second NMOS and the third NMOS share a doping region as a co-source terminal; and
a fourth gate strip, disposed immediately adjacent to the first third gate strip and the second third gate strip, wherein the fourth gate strip is configured to be a co-gate terminal of the fourth PMOS and a fourth NMOS, the third PMOS and the fourth PMOS share a doping region as a co-drain terminal, and the third NMOS and the fourth NMOs share a doping region as a co-drain terminal.

13. The input circuit of claim 12, wherein the co-source terminal of the second PMOS and the third PMOS is directed to a first voltage source, and the co-source terminal of the second NMOS and the third NMOS is directed to a second voltage source.

14. The input circuit of claim 12, wherein a source terminal of the first PMOS and a source terminal of the fourth PMOS is directed to a first voltage source, and a source terminal of the first NMOS and a source terminal of the fourth terminal are directed to a second voltage source.

15. The input circuit of claim 12, wherein the first first gate strip is connected to the second third gate to direct to a first signal.

16. The input circuit of claim 12, wherein the second first gate strip is connected to the first third gate to direct to a first signal.

17. The input circuit of claim 13, wherein a source terminal of the first PMOS and a source terminal of the fourth PMOS is connected via a conductive line.

18. The input circuit of claim 13, wherein a source terminal of the first NMOS and a source terminal of the fourth NMOS is connected via a conductive line.

19. An input circuit of a flip-lop, comprising:
a first multiplexer, comprising a first PMOS, a second PMOS and a third PMOS;
a second multiplexer, comprising a first NMOS, a second NMOS and a third NMOS;
a clock receiving NMOS, wherein a first clock signal is directed to a gate terminal of the clock receiving NMOS, and a source terminal of the clock receiving NMOS is coupled to the second multiplexer;
a clock receiving PMOS, wherein a second clock signal is directed to a gate terminal of the clock receiving PMOS, a source terminal of the clock receiving PMOS is coupled to the first multiplexer, and a drain terminal of the clock receiving PMOS is coupled to a drain terminal of the clock receiving NMOS;
a first gate strip, wherein the first gate strip is configured to be a co-gate terminal of the first PMOS and the first NMOS;
a second gate strip, disposed immediately adjacent to the first gate strip, wherein the second gate strip is configured to be a co-gate terminal of the second PMOS and the second NMOS, the first PMOS and the second PMOS share a doping region as a co-source terminal, and the first NMOS and the second NMOS share a doping region as a co-source terminal; and
a third gate strip, disposed immediately adjacent to the second gate strip, wherein the third gate strip is configured to be a co-gate terminal of the third PMOS and the third NMOS, the second PMOS and the third PMOS share a doping region as a co-drain terminal, and the second NMOS and the third NMOS share a doping region as a co-drain terminal.

20. The input circuit of claim 19, wherein the first multiplexer further comprises a fourth PMOS and the second multiplexer further comprises a fourth NMOS, and the input circuit further comprises:
a fourth gate strip, disposed immediately adjacent to the first gate strip, wherein the fourth gate strip is configured to be a gate terminal of the fourth PMOS, and the first PMOS and the fourth PMOS share a doping region as a co-drain terminal; and
a fifth gate strip, disposed immediately adjacent to the third gate strip, wherein the fifth gate strip is configured to be a gate terminal of the fourth NMOS, and the third NMOS and the fourth NMOS share a doping region as a co-source terminal.

* * * * *